US008742841B2

(12) United States Patent
Alexander

(10) Patent No.: US 8,742,841 B2
(45) Date of Patent: Jun. 3, 2014

(54) PWM RE-CLOCKING SCHEME TO REJECT ACCUMULATED ASYNCHRONOUS JITTER

(71) Applicant: Equiphon, Inc., Austin, TX (US)

(72) Inventor: Mark A. Alexander, Austin, TX (US)

(73) Assignee: Equiphon, Inc., Austin, TX (US)

( * ) Notice: Subject to any disclaimer, the term of this patent is extended or adjusted under 35 U.S.C. 154(b) by 57 days.

(21) Appl. No.: 13/646,236

(22) Filed: Oct. 5, 2012

(65) Prior Publication Data
US 2013/0088297 A1 Apr. 11, 2013

Related U.S. Application Data

(60) Provisional application No. 61/543,998, filed on Oct. 6, 2011.

(51) Int. Cl.
*H03F 3/38* (2006.01)
(52) U.S. Cl.
USPC ............................................. 330/10; 330/251
(58) Field of Classification Search
USPC .......... 330/10, 207 A, 251; 332/109; 375/238
See application file for complete search history.

(56) References Cited

U.S. PATENT DOCUMENTS

| 6,693,457 B2 * | 2/2004 | Yepp ................................ 326/63 |
| 7,800,444 B2 * | 9/2010 | Tsukamoto ..................... 330/10 |
| 2010/0026343 A1 * | 2/2010 | Yang et al. ....................... 326/80 |

* cited by examiner

*Primary Examiner* — Khanh V Nguyen
(74) *Attorney, Agent, or Firm* — Meyertons Hood Kivlin Kowert & Goetzel, P.C.; Jeffrey C. Hood

(57) ABSTRACT

An amplifier may use pulse-width modulators controlling respective sets of switches to produce an amplified version of a source signal. A phase locked loop in the amplifier may generate a differential clock signal. A first processing element operating according to a first supply voltage may generate a PWM signal representative of the source signal, and also generate a clock enable signal corresponding to the differential clock signal. A second processing element (PE2) may receive the differential clock signal, the PWM signal, and the clock enable signal, and level shift the PWM signal and the clock enable signal to operate according to a second supply voltage, and may generate a resampling clock signal from the differential clock signal according to the level shifted clock enable signal. The PE2 may provide a PWM output signal representative of the source signal by resampling the level shifted PWM signal with the resampling clock signal.

11 Claims, 5 Drawing Sheets

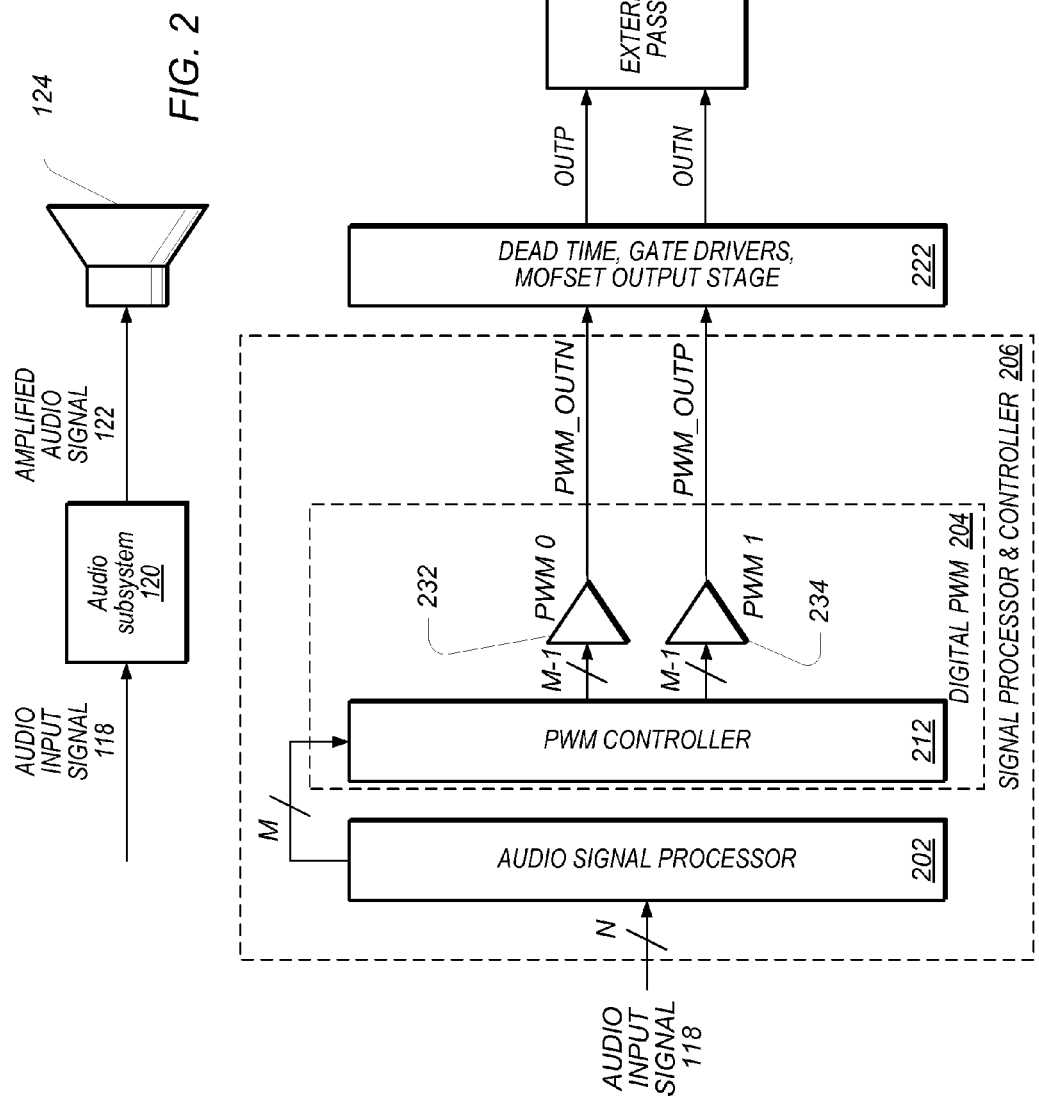

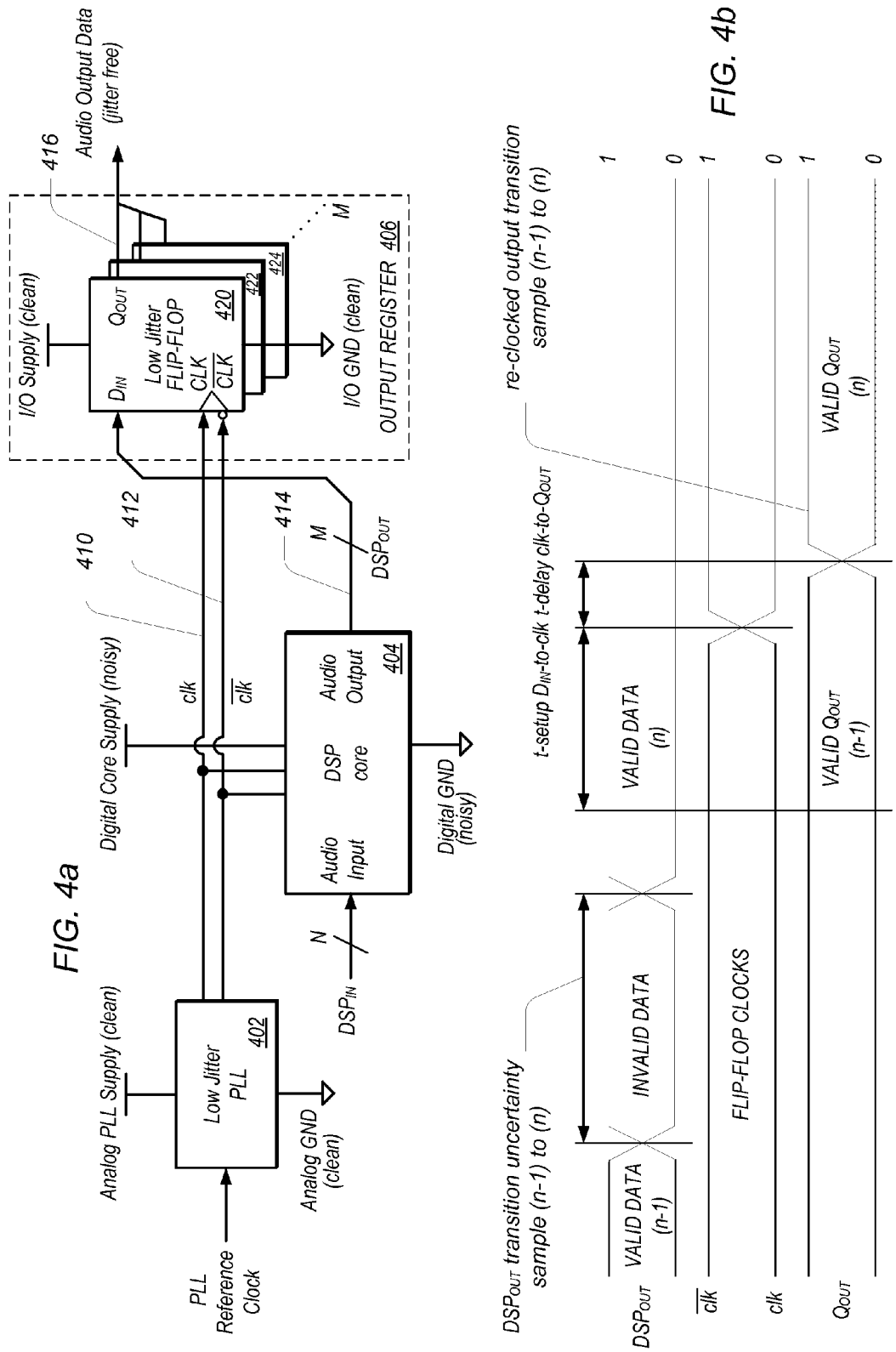

PWM RE-CLOCKING SCHEME TO REJECT ACCUMULATED ASYNCHRONOUS JITTER

PRIORITY CLAIM

This application claims benefit of priority of U.S. provisional application Ser. No. 61/543,998 titled "Circuits and Methods Used in Audio Signal Processing", filed Oct. 6, 2011, which is hereby incorporated by reference in its entirety as though fully and completely set forth herein.

FIELD OF THE INVENTION

The present invention relates generally to signal processing, and more particularly to re-clocking signals in an amplifier to reject accumulated asynchronous jitter.

DESCRIPTION OF THE RELATED ART

Signal processing represents a combined application of electrical/computer engineering and mathematical principles, primarily directed to the analysis of and operation on either discrete or continuous time signals. Signals of interest can include sound, images, time-varying measurement values and sensor data, for example biological data such as electrocardiograms, control system signals, telecommunication transmission signals such as radio signals, and many others. Signals are typically analog and/or digital electrical representations of time-varying or spatial-varying physical quantities. Types of signal processing include analog, discrete time, and digital.

Analog signal processing is performed on signals that have not been digitized, for example signals that are used in classical radio, telephone, radar, and television systems. Analog signal processing typically makes use of linear electronic circuits such as passive filters, active filters, additive mixers, integrators and various types of delay lines, as well as non-linear circuits such as frequency mixers and voltage-controlled amplifiers, voltage-controlled filters, voltage-controlled oscillators and phase-locked loops. Discrete time signal processing is performed on sampled signals that are defined at discrete points in time, and as such are quantized in time, but not in magnitude. Analog discrete-time signal processing is based on electronic devices such as sample and hold circuits, analog time-division multiplexers, analog delay lines and analog feedback shift registers, and may be considered a predecessor of digital signal processing.

Digital signal processing involves the processing of digitized discrete-time sampled signals. Processing is typically performed by general-purpose computers or digital circuits such as application specific integrated circuits (ASICs), field-programmable gate arrays, or specialized digital signal processors (DSPs). Digital signal processing mostly includes performing arithmetic operations such as fixed-point and floating-point operations, real-valued and complex-valued operations, multiplication and addition. Many of these operations are implemented through the use of circular buffers and look-up tables. Examples of digital signal processing algorithms include Fast Fourier transforms (FFT), finite impulse response (FIR) filters, infinite impulse response (IIR) filters, and adaptive filters such as the Wiener and Kalman filters.

Audio signal processing, sometimes referred to as audio processing, is the processing of electrical signals that correspond to auditory signals, or sound. Since audio signals may be electronically represented in either digital or analog format, audio signal processing may also take place in either the analog or digital domain. In analog audio signal processing, operations are performed directly on the electrical signals corresponding to the audio signals, while digital signal processing consists mostly of mathematical operations performed on digital representations of the electrical signals that correspond to respective audio signals. Typically, the digital representation of audio signals expresses the pressure waveform that characterizes the audio signal as a sequence of binary numbers. This permits signal processing using digital circuits such as microprocessors and computers, and while analog to digital conversion can be prone to loss, most modern audio systems use the digital approach because digital signal processing techniques are overall more powerful and efficient than signal processing in the analog domain.

Overall, since audio signals first need to be converted to electrical signals, digital audio processing systems include both analog and digital components in a full processing path that begins with the pressure waveforms that physically define the audio signal and ends with the digital representation of the corresponding electrical signals derived therefrom. Some of the most common components typically used in audio processing systems include pulse-width modulators, power limiters, start-up circuits, power regulators, comparators, amplifiers, oscillators, among others. The quality and operating precision of these components directly impacts the quality of audio signal processing systems, as designers have to continually overcome numerous difficult design challenges to meet required specifications and quality standards.

Signal integrity from a clocking or timing standpoint is important for many digital or "sampled data" signal processing applications. In particular, in many high-resolution digital audio systems, the arrival times for successive audio samples must be highly correlated and well bounded in terms of the absolute deviation from one another, in order to avoid adversely affecting certain system level performance parameters. These parameters include easily measurable attributes such as the noise-floor or "signal-to-noise-ratio" of a system. Failure to observe such timing-related signal integrity criteria may result in the overall system's failing to meet its stated target performance specifications.

SUMMARY OF THE INVENTION

The output of an amplifier, for example an open-loop amplifier or a closed-loop amplifier, may be configured in either single-ended or differential mode, where the differential mode may be a bridge-tied load (BTL) mode. An amplifier having an output configured in single-ended mode may electrically drive a half-bridge circuit in which a set of two switches, that is, a high-side switch and a low-side switch are used in a push-pull (totem-pole) configuration. An amplifier having an output configured in differential mode (i.e. having differential outputs) may electrically drive an output power stage in a full-bridge configuration in which two half-bridge circuits are connected to form an effective full-bridge circuit. In one set of embodiments, a differential output amplifier may be constructed as an all-digital class-BD amplifier that may include two or more pulse-width modulators (PWMs) controlling the respective sets of switches in the full-bridge output circuit to produce an amplified output (or amplified version) of a small (audio) input signal.

In one set of embodiments, the amplifier may include a phase-locked loop (PLL) to generate a differential clock signal based on a reference clock signal provided from an external audio source that also provides the audio source signal to the amplifier. An audio processor operating according to a first supply voltage (level) may generate the PWM signal(s) and also provide a clock enable signal corresponding to the differential clock signal generated by the PLL. The amplifier may further include a level-shift circuit that receives the differential clock signal, the PWM signal(s), and the clock enable signal, and level shift the PWM signal(s) and the clock enable signal to operate according to a second supply voltage. The level-shift circuit may further generate a resampling clock signal from the differential clock signal according to the level shifted clock enable signal, and provide a PWM output signal(s) representative of the source signal by resampling the level shifted PWM signal(s) with the resampling clock signal.

BRIEF DESCRIPTION OF THE DRAWINGS

A better understanding of embodiments of the present invention may be obtained when the following Detailed Description is considered in conjunction with the following drawings, in which:

FIG. 2 is a block diagram of a portion of a system including a multi-channel audio subsystem that may be operated according to various embodiments;

FIG. 3 is an exemplary block diagram of an audio subsystem which may be operated according to various embodiments;

FIG. 4a shows a system level diagram illustrating the concepts of a re-clocking scheme according to one embodiment;

FIG. 4b shows a timing diagram depicting waveforms for the input and output signals of the flip flops in FIG. 4a;

FIG. 5 shows a partial logic diagram of one embodiment of a PWM audio amplifier subsystem featuring the re-clocking circuit of FIG. 4a.

Figure 1:
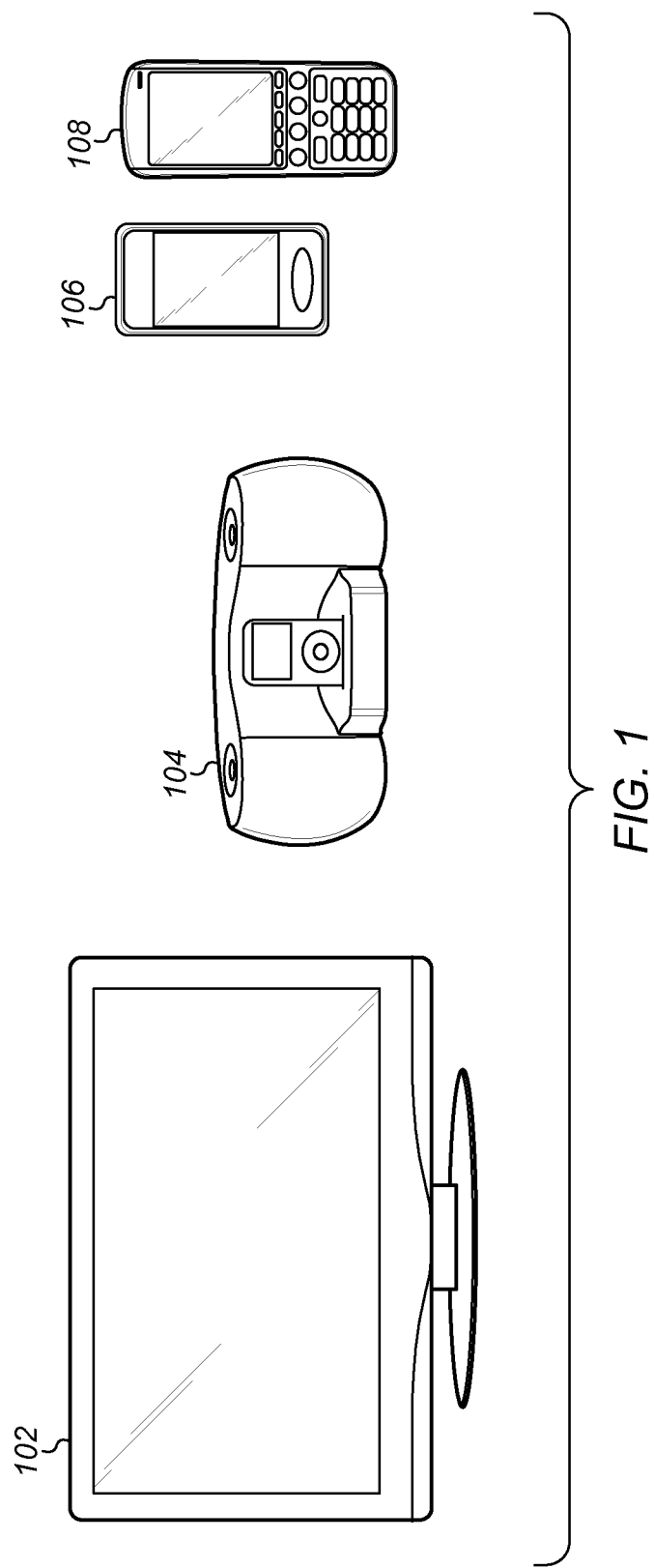
FIG. 1 illustrates various exemplary systems or devices which may use the techniques described herein.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIG. 1 illustrates exemplary systems, which may utilize the techniques described above. More specifically, FIG. 1 illustrates exemplary systems, which may utilize an audio subsystem, (which may include an amplifier such as a Class D amplifier), featuring various improvements. As shown, embodiments of the techniques disclosed herein may be used in any one ore more of various systems which involve the amplification of signals. For example, embodiments of the invention may be used in various systems that operate to amplify audio signals for provision to a loudspeaker for audible presentation. As shown, the exemplary systems may include a display device 102; an audio system 104, such as a stereo amplified docking station for a portable music player, CD player, etc.; or a telephone 106 and 108, such as a smart phone, e.g., an iPHONE™ or other similar type of smart phone. It should be noted that FIG. 1 is provided by way of example, and is by no means intended to be exhaustive. Accordingly, various embodiments disclosed herein may equally be used in other applications and systems not shown in FIG. 1, where limiting the output power is desired. It is also noted that the various terms or designations for circuits, such as "offset", "driver", etc. are merely names or identifiers used to distinguish among these circuits, and these terms are not intended to connote any specific meaning.

FIG. 2 illustrates an example of an Audio subsystem 120 which may be present in the systems of FIG. 1. In one set of embodiments, audio subsystem may be an amplifier subsystem, which may more specifically be a class D amplifier subsystem. In one or more of the devices of FIG. 1, at least one Audio subsystem 120 may be present in the audio output section of the device, and more specifically in the amplifier portion of the audio section of the device. As shown in FIG. 2, an audio input signal 118 may be received at an input to the Audio subsystem 120. The Audio subsystem 120 receives the audio input signal 118 and operates to amplify the received audio input signal to produce amplified audio output signal 122. The amplified audio output signal 122 may then be provided to loudspeaker 124 for audible presentation.

FIG. 3 is an exemplary block diagram of an audio subsystem (which, in some embodiments, may be one implementation of a Class D amplifier). As shown in FIG. 3, the audio subsystem comprises an input that receives digital audio data, which is an N-bit pulse code modulated (PCM) input signal. The audio subsystem also includes a digital signal processor, referred to as Audio Signal Processor ASP 202, which receives the input signal and generates output data that is configured for use in generating a pulse train driver signal that corresponds to the input signal. The ASP 202 receives the N-bit input signal, and generates an M-bit output, which is provided to a Digital PWM (Pulse-width Modulator) block 204.

The Digital PWM block 204 includes a PWM Controller 212, two PWM driver blocks labeled PWM0 (232) and PWM1 (234), and may contain other logic as well. The PWM Controller 212 calculates edge locations of the pulse train to be generated, and produces two (M−1)-bit outputs. In particular, each of the two (M−1)-bit outputs may represent respective edges of pulses to be generated. The two (M−1)-bit outputs are used by individual pulse-width modulators PWM0 and PWM1 to produce the final differential PWM outputs PWM_OUTP and PWM_OUTN. In general, PWM block 204 may comprise a small signal-processing block that operates on the M-bit input data and separates the M-bit input data into two individual streams of M−1 bits each. These (M−1)-bit streams may be independent, or, more specifically, they may have some correlation to each other, while the actual data may differ on an instantaneous pulse-by-pulse basis.

Block 222 comprises logic for handling dead time, as well as a MOSFET Power Output Stage and gate drivers for controlling the MOSFET Power Output Stage. The MOSFET Power Output Stage portion of block 222 may include high power switches, preferably MOSFETs (Metal Oxide Semiconductor Field Effect Transistors). The high power switches generate a high-power (amplified) replica of the received pulse train. The MOSFET Power Output Stage portion provides the amplified pulse train to low pass filter 224. As shown, the Output Stage provides a differential pair of output signals, referred to as OUTP and OUTN, which provide two differential pulses per PWM period. The low pass filter 224 performs a low pass filter operation on the differential pulses and provides the two outputs, referred to as OUTP_FILT and OUTN_FILT, to a load, e.g., to a loudspeaker 124.

PWM Re-Clocking Scheme To Reject Accumulated Asynchronous Jitter

High resolution PWM signals, whose absolute pulse-width may be a representation of the instantaneous amplitude of a reconstructed analog output signal, as shown in FIG. 3 for example, are sensitive to timing errors that may accumulate along the signal processing path, prior to MOSFET output stage 222. Assuming that the amplitude of the output PWM signal or "pulse-height" is constant throughout a given sample period, any deviation in absolute pulse-width compared to that which would be reproduced by a hypothetical "perfect pulse-width-modulator" constitutes a measurable and finite timing error. Any timing error in the generation of the fixed amplitude PWM pulses on the outputs OUTP and OUTN (from MOSFET output stage 222) may produce a resultant near-instantaneous amplitude error at the differential output of External Low Pass Filter 224, with filter 224 performing a continuous-time integration of the rectangular shaped pulses from MOSFET output stage 222. The errors described above normally arise due to non-idealities in the design of the logic circuitry, which includes the digital signal processing path encompassing Audio Signal processor 202 and digital PWM 204 that generate the PWM_OUTN and PWM_OUTP signals. These non-idealities occur as a result of the necessary circuit design trade-offs and area constraints made during the design phase.

The aforementioned timing errors may occur due to injection of noise, from a variety of sources such as the power supply and ground rails, into the logic circuitry that includes Audio Signal processor 202 and Digital PWM 204. Typically, the digital core power supply rails that provide power to processing blocks 202 and 204 are noisy due to time-dependent voltage drops caused by high peak currents that may be drawn during internal logic state transitions. These power supply currents contain DC or static components as well as AC or dynamic components. The AC or dynamic supply current components may be both random in nature and highly correlated with the numerical values of both the input and output data. Furthermore, the AC or dynamic supply currents may also depend on the time-varying values of temporary internal variables used during numerical computations performed within blocks 202 and 204, such variables often stored in static or dynamic register files or Random-Access-Memory (RAM), which are known to draw signal dependent currents.

It should be noted that the injection of correlated power supply noise into the circuitry of Audio Signal processor 202 and Digital PWM 204 may result in a variable or "data-dependent" processing delay that causes the absolute arrival time or availability of output samples to vary slightly with their numerical value. These data-dependent timing errors also affect the instantaneous pulse-width at the output of Digital PWM 204 if not properly suppressed, and may adversely affect the fidelity of the recovered analog output signal formed by taking the difference between OUTP_FILT and OUTN_FILT at the output of low pass filter 224.

Data-dependent and random timing variations, both of which accumulate along the PWM signal processing chain, may introduce short term deviations in the absolute time locations of the low-to-high and/or high-to-low edge transitions of the high precision PWM pulses on PWM_OUTN and PWM_OUTP. Such edge timing variations are known as "jitter", which may reach a level of magnitude that may degrade the audio performance of the overall amplifier subsystem. Therefore, it is highly desirable to mitigate the deleterious effects of both random and data-dependent timing variations.

A digital system may be designed with a provision to considerably reduce or eliminate the jitter that accumulates on sampled audio data received from a noisy digital core. This may be accomplished, with minimal additional complexity, by re-clocking or "re-timing" the audio output data with an edge triggered D-type output register which is driven (clocked) by a low jitter clock, before transmitting the data to successive stages. The system level diagram of one embodiment of a re-clocking scheme is shown in FIG. 4a. In the embodiment shown in FIG. 4a, an Output Register 406, which includes a number (M) of edge triggered D-type flip-flops (420, 422, 424, etc.) is driven directly by a low jitter clock signal that is obtained from Low Jitter PLL 402. A timing diagram shown in FIG. 4b illustrates how the re-clocking is accomplished. As long as the sample (n) output data received on $DSP_{OUT}$ bus 414 from DSP core 404 has stabilized and is valid, prior to the minimum required $D_{IN}$-to-CLK setup time for output register 406, the re-clocked sample (n) data transition at the output of register 406 is free of the deleterious jitter and timing uncertainties present at its input. The level of jitter present in the re-timed data at the output of register 406 is therefore primarily determined by the level of jitter in the clock signals 410 and 412 received from Low Jitter PLL 402. A low jitter level at the output of PLL 402 may be achieved by using appropriate design techniques well known in the art of PLL circuit design.

The circuit in Output Register 406 receiving the differential clock from Low Jitter PLL 402 may preferably be operated directly from the clean I/O supply. A low frequency clock reference may be provided to PLL 402, which is used to generate a higher frequency high-precision differential clock output that includes a non-inverted signal 410, and an inverted/complementary signal 412. The high precision differential clock outputs 410 and 412 from PLL 402 may be related to the low frequency PLL reference clock by an integer multiplication ratio. Audio input data provided to Digital Signal Processing (DSP) unit 404 may also be clocked using the same precision clock signals 410 and 412 that are provided to Output Register 406.

Figure 5:
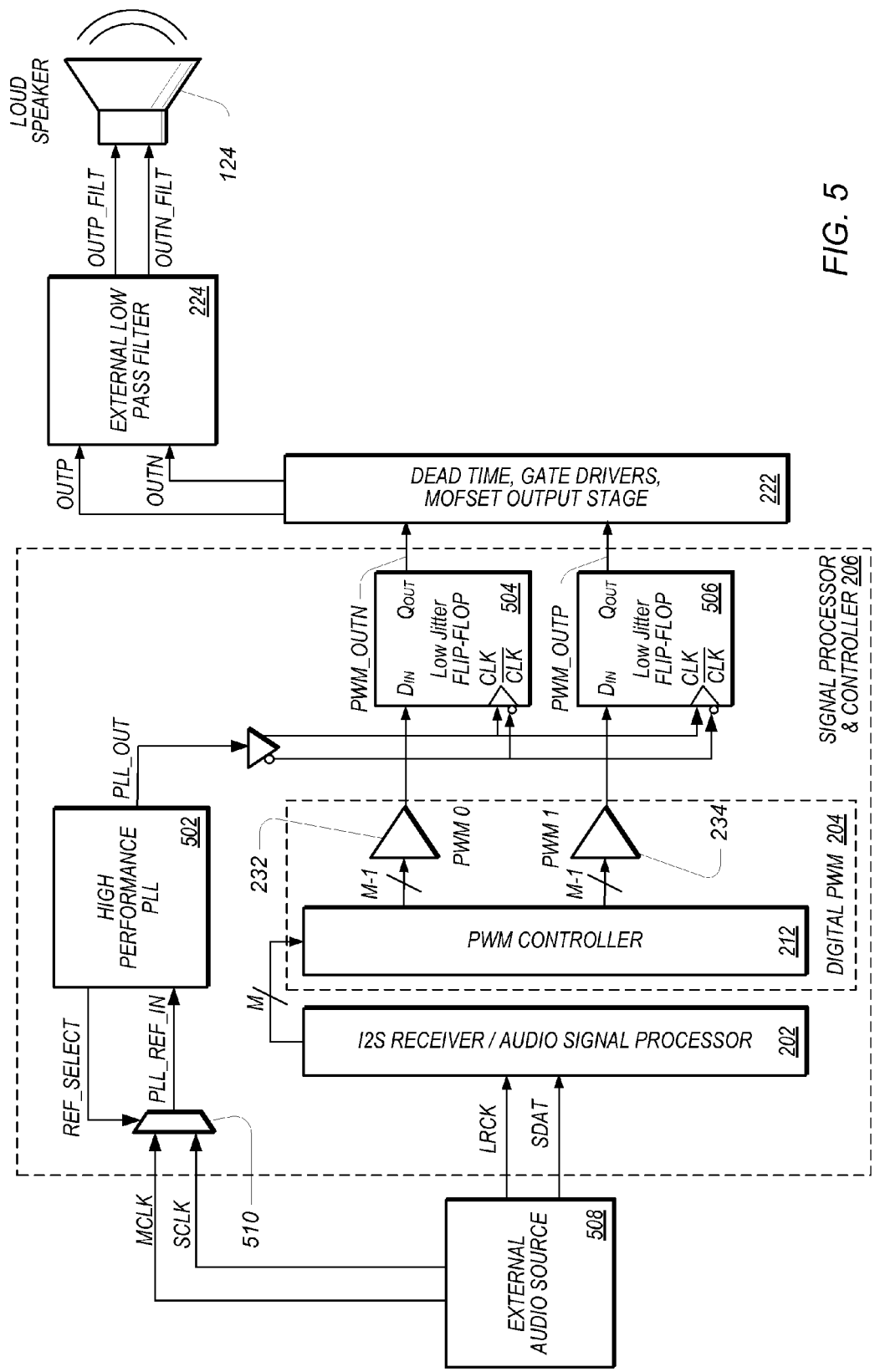

One embodiment of a PWM audio amplifier subsystem implemented at chip level and featuring the re-clocking arrangement depicted in FIG. 4a may include a multi-die solution where the re-timing of the PWM data occurs immediately prior to transmitting signals PWM_OUTP and PWM_OUTN off-chip to the power output stage. One embodiment of such a PWM audio amplifier solution is shown in FIG. 5. In the embodiment shown in FIG. 5, Audio Signal Processor 202 and Digital PWM 204, as previously shown in FIG. 3, are contained on a separate signal processing plus PWM controller die 206. The MOSFET power stage 222 is contained on a separate power output die, and may be conveniently co-packaged with Signal Processor & Controller die 206 in a "Multi-Chip-Module", also referred to as an MCM.

A re clocking circuit as described above, and comprising Low Jitter Flip-Flops 504 and 506, clocked respectively by High Performance PLL 502, is included in Signal Processor & Controller 206 for the purpose of re-timing the final PWM_OUTN and PWM_OUTP signals immediately prior to transmitting them off chip to power stage 222. This approach minimizes or eliminates all random and signal dependent jitter which may have accumulated within Audio Signal Processor block 202 and Digital PWM block 204, and thereby produces PWM_OUTN and PWM_OUTP signals having minimal or no jitter. The audio system shown in FIG. 5 may include a high performance PLL 502, also configured to reject input jitter present on the SCLK or MCLK inputs from the External Audio Source 508, thus further improving overall audio amplifier performance. The reference clock for PLL 502 may be selected through multiplexer 510.

Figure 6:
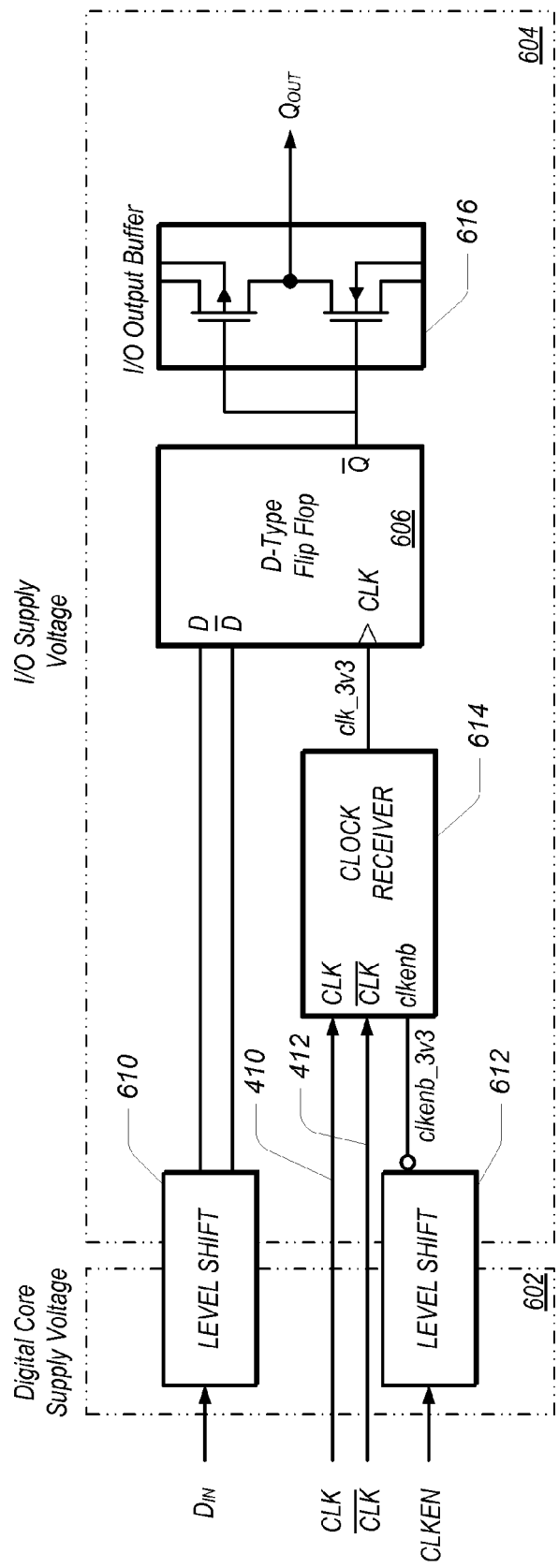
FIG. 6 shows a block diagram of one embodiment of the D-Type flip flop from FIG. 4a with embedded clock receiver and data input level shift circuitry and an optional clock enable input.

The block diagram of one embodiment of the Low Jitter Flip Flop circuit (e.g. 420) of FIG. 4a, is shown in FIG. 6. A clock enable input "CLKEN" is added as a convenience feature, and allows the option of clock gating by the Digital PWM 204, as may be required in a practical implementation. The $D_{IN}$ and clock enable signals may be provided to level shift units 610 and 612, respectively. A key feature of the arrangement shown in FIG. 5 is that any additional and potentially deleterious jitter introduced solely by the $D_{IN}$ level shift block 610 is outside the critical re-clocking path, and therefore has minimal if any impact on system level performance. A clock receiver 614 may receive the differential clock signals 410/412 directly from the High Performance PLL 502, and provide a high-voltage clock signal directly to D Flip-Flop 606. The $Q_{bar}$ output signal from Flip Flop 606 is subsequently provided to I/O Output Buffer 616 that generates the final PWM output signal $Q_{OUT}$, which is then provided off-chip to the separate power stage die 222.

Although the embodiments above have been described in considerable detail, numerous variations and modifications will become apparent to those skilled in the art once the above disclosure is fully appreciated. Furthermore, as used herein, a "complement logic state" of a given logic state is used to denote a state that is the logical complement of the given logic state. For example, if the given logic state is '1', the complement logic state of the given logic state is '0'. It is intended that the following claims be interpreted to embrace all such variations and modifications.

The invention claimed is:

1. An amplifier comprising:
a phase-locked-loop (PLL) configured to generate a differential clock signal;
a first processing element configured to operate according to a first supply voltage, and further configured to derive at least a first representative signal from a source signal; and
a second processing element configured to:
receive the differential clock signal and the first representative signal;
level shift the first representative signal to operate according to a second supply voltage;
generate a resampling clock signal from the differential clock signal; and
provide a control signal representative of the source signal by resampling the level shifted first representative signal with the resampling clock signal.

2. The amplifier of claim 1, wherein the first processing element is further configured to provide a clock enable signal corresponding to the differential clock signal; and
wherein the second processing element is further configured to:
receive the clock enable signal;
level shift the clock enable signal to operate according to the second supply voltage; and
generate the resampling clock signal from the differential clock signal according to the level shifted clock enable signal.

3. The amplifier of claim 2, wherein the level shifted clock enable signal is configured to:
enable the resampling clock signal when the level shifted clock enable signal is representative of a specific logic state; and
disable the resampling clock signal when the level shifted clock enable signal is representative of a complement logic state of the specific logic state.

4. The amplifier of claim 1, wherein the source signal is an audio signal, and the first representative signal and the control signal are pulse-width modulated signals.

5. The amplifier of claim 1, wherein the PLL, the first processing element, and the second processing element are configured on a single integrated circuit die.

6. The amplifier of claim 1, wherein the first supply voltage is a digital core supply voltage, and the second supply voltage is an input/output supply voltage.

7. The amplifier of claim 1, wherein the PLL is powered by a separate, clean, analog power supply having a same nominal value as the first supply voltage.

8. The amplifier of claim 1, further comprising a power MOSFET output stage controlled by the control signal.

9. The amplifier of claim 8, wherein the power MOSFET output stage is configured on an integrated circuit die separate from one or more circuit dies on which the PLL, the first processing element, and the second processing element are configured.

10. The amplifier of claim 8, wherein the power MOSFET output stage is configured on a same integrated circuit die as the PLL, the first processing element, and the second processing element.

11. The amplifier of claim 8, wherein the power MOSFET output stage is configured as a discrete transistor circuit assembled on a same printed circuit board as a packaged integrated circuit die containing the PLL, the first processing element, and the second processing element.

* * * * *